United States Patent
Jung et al.

(10) Patent No.: US 9,502,091 B1
(45) Date of Patent: Nov. 22, 2016

(54) SENSING CIRCUIT FOR RESISTIVE MEMORY CELLS

(71) Applicants: QUALCOMM Incorporated, San Diego, CA (US); Industry-Academic Cooperation Foundation, Yonsei University, Seoul (KR)

(72) Inventors: Seong-Ook Jung, Seoul (KR); Taehui Na, Seoul (KR); Byung Kyu Song, Seoul (KR); Jung Pill Kim, San Diego, CA (US); Seung Hyuk Kang, San Diego, CA (US)

(73) Assignees: QUALCOMM Incorporated, San Diego, CA (US); Industry-Academic Cooperation Foundation, Yonsei University, Seoul (KR)

( * ) Notice: Subject to any disclaimer, the term of this patent is extended or adjusted under 35 U.S.C. 154(b) by 0 days.

(21) Appl. No.: 14/843,546

(22) Filed: Sep. 2, 2015

(51) Int. Cl.
G11C 11/00 (2006.01)
G11C 11/16 (2006.01)
G11C 7/12 (2006.01)
G11C 7/06 (2006.01)
G11C 11/4091 (2006.01)
G11C 11/4097 (2006.01)

(52) U.S. Cl.
CPC ........... G11C 11/1673 (2013.01); G11C 7/065 (2013.01); G11C 7/12 (2013.01); G11C 11/4091 (2013.01); *G11C 11/4097* (2013.01)

(58) Field of Classification Search
CPC . G11C 11/4091; G11C 11/4097; G11C 7/12; G11C 7/065
USPC ................................. 365/158, 205, 206, 207
See application file for complete search history.

(56) References Cited

U.S. PATENT DOCUMENTS

| | | | | |
|---|---|---|---|---|
| 5,608,676 | A | * | 3/1997 | Medlock ............ G11C 16/0433 365/189.09 |
| 6,519,175 | B2 | | 2/2003 | Sadayuki |
| 7,825,698 | B2 | | 11/2010 | Tran et al. |
| 7,974,146 | B2 | | 7/2011 | Barkley |
| 8,917,562 | B2 | * | 12/2014 | Wang ................. G11C 13/0004 365/158 |
| 9,165,630 | B2 | * | 10/2015 | Jung ....................... G11C 7/06 |
| 2014/0269031 | A1 | * | 9/2014 | Jung .................. G11C 11/1673 365/158 |
| 2015/0022264 | A1 | | 1/2015 | Kim et al. |

OTHER PUBLICATIONS

Chang M.F., et al., "An Offset-Tolerant Fast-Random-Read Current-Sampling-Based Sense Amplifier for Small-Cell-Current Nonvolatile Memory," IEEE Journal of Solid-State Circuits, Mar. 2013, vol. 48 (3), pp. 864-877.

Durlam M., et al., "A 1-Mbit MRAM Based on 1T1MTJ Bit Cell Integrated With Copper Interconnects," IEEE Journal of Solid-State Circuits, May 2003, vol. 38, No. 5, pp. 769-773.

Na T., et al., "Reference-Scheme Study and Novel Reference Scheme for Deep Submicrometer STT-RAM," IEEE Transactions on Circuits and Systems—I: Regular Papers, Dec. 2014, vol. 61, No. 12, pp. 3376-3385.

* cited by examiner

*Primary Examiner* — Pho M Luu
(74) *Attorney, Agent, or Firm* — Muncy, Geissler, Olds & Lowe, P.C.

(57) ABSTRACT

A sensing system may include a sense amplifier, a sensing circuit configured to sense a current difference, a data cell selectively coupled to the sensing circuit, a first reference cell selectively coupled to the sensing circuit, and a second reference cell selectively coupled to the sensing circuit. The resistance of the first reference cell and the second reference cell are different.

20 Claims, 9 Drawing Sheets

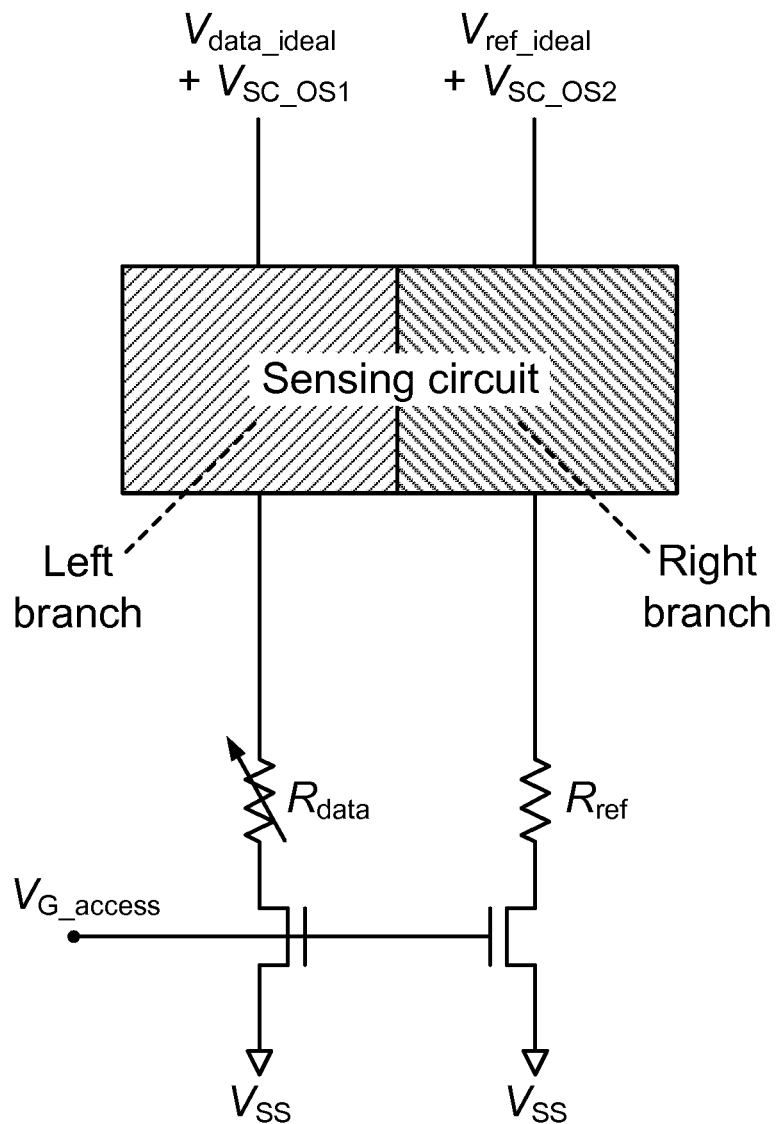
CONVENTIONAL
FIG. 1A

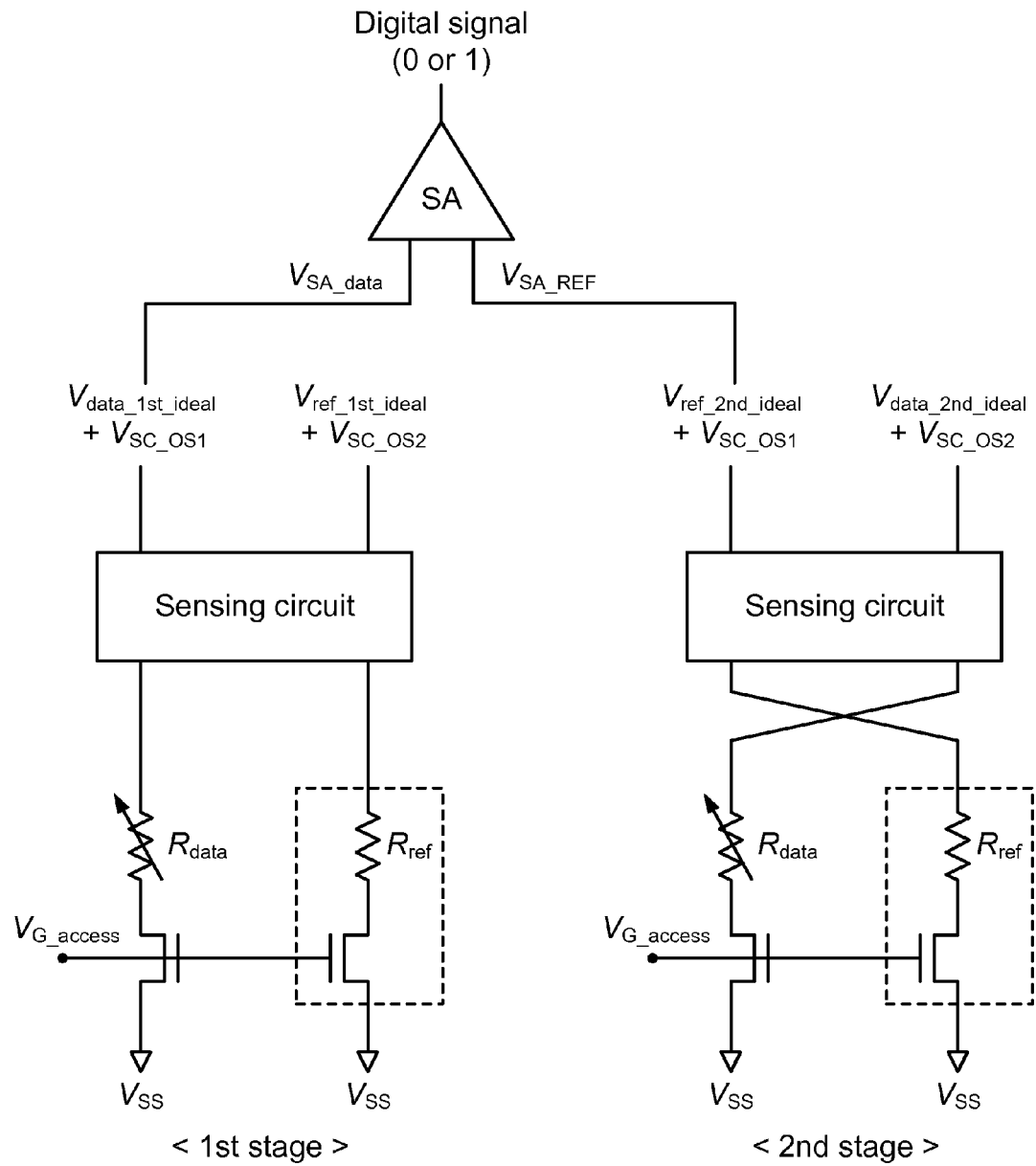
CONVENTIONAL
FIG. 1B

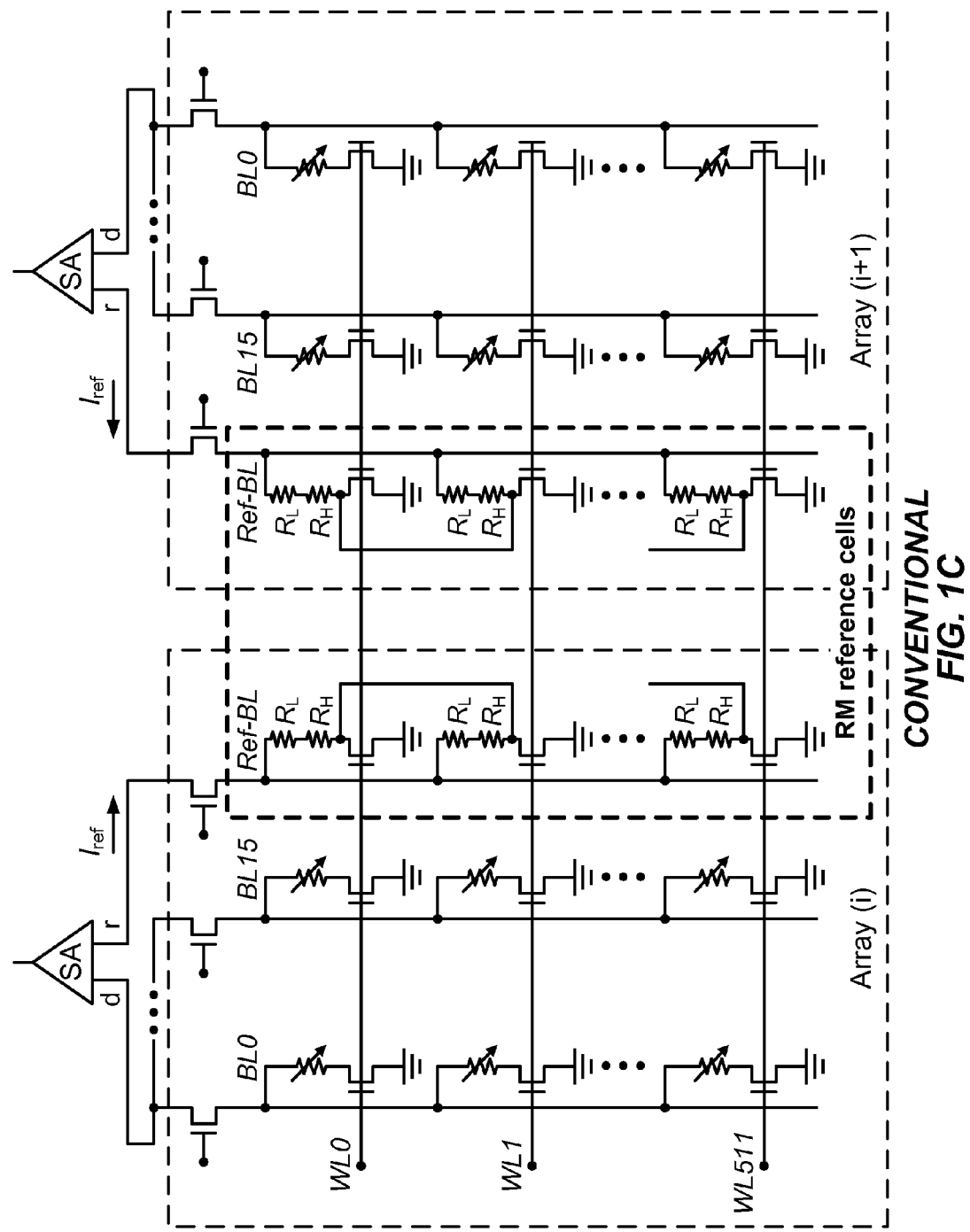
CONVENTIONAL
FIG. 1C

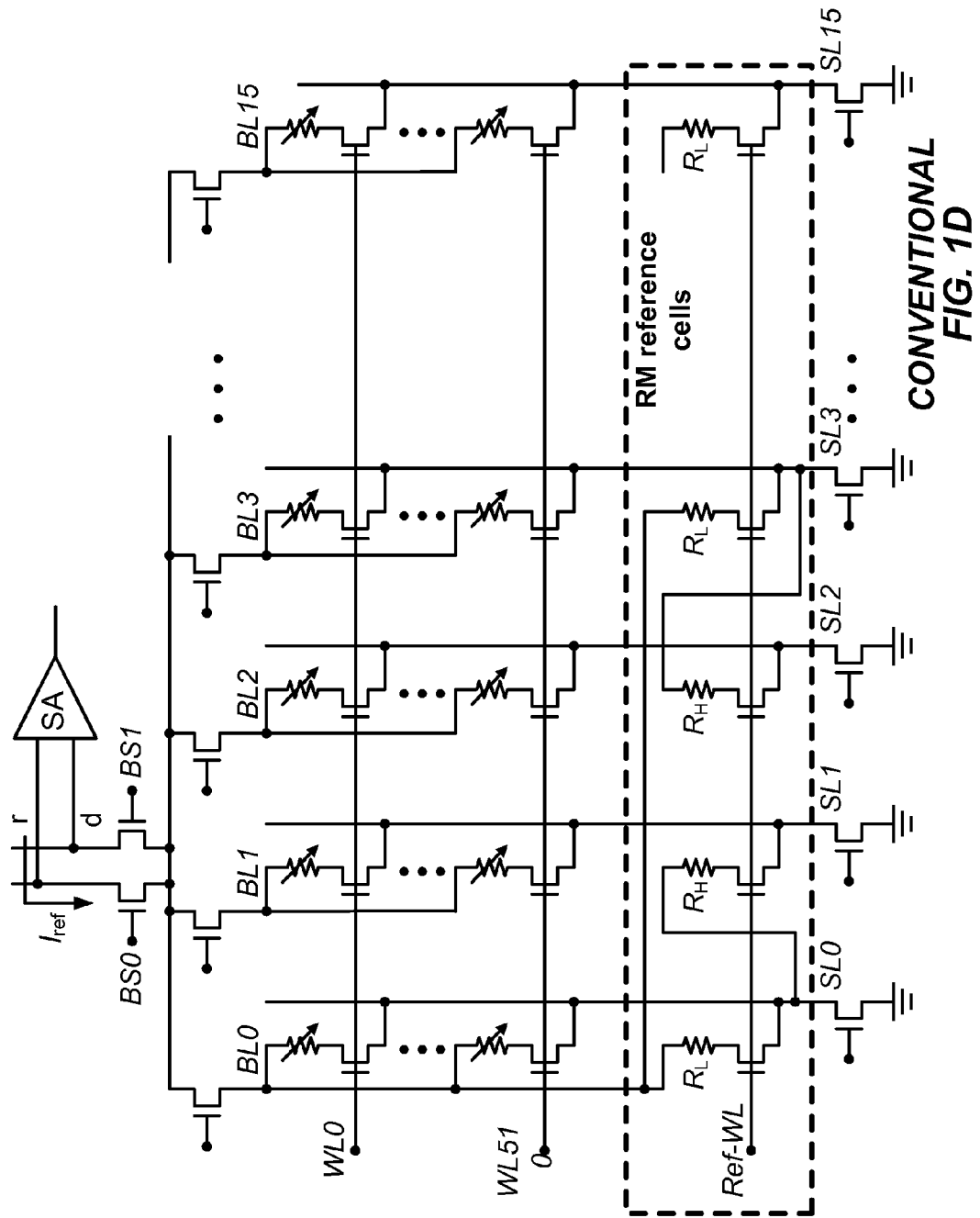
CONVENTIONAL
FIG. 1D

SENSING CIRCUIT FOR RESISTIVE MEMORY CELLS

FIELD OF DISCLOSURE

This disclosure relates generally to integrated logic sensing circuits, and more specifically, but not exclusively, to a sensing circuit for resistive data cells.

BACKGROUND

Memory devices conventionally include arrays of bit cells that each store a bit of data. Each data bit can represent a logical zero ("0") or a logical one ("1"), which may correspond to a state of the bit cell. During a read operation of a selected bit cell, a voltage level close to ground may be representative of "0" and a relatively higher voltage level may be representative of "1". Bit lines are coupled to various bit cells in the memory array and the bit lines couple the bit cells to other components used in read/write operations.

Magnetoresistive random access memory (MRAM) is a non-volatile memory technology where data is stored based on magnetization polarities of bit cells. In contrast to conventional RAM technologies that store data as electric charges or current flows, MRAM uses magnetic elements. A magnetic tunnel junction (MTJ), which is conventionally used as a storage element or bit cell for MRAM technology, can be formed from two magnetic layers, each of which can hold a magnetic moment, separated by an insulating (tunnel barrier) layer. Conventionally, the fixed layer is set to a particular polarity. The free layer's polarity is free to change to match that of an external magnetic field that can be applied. A change in the polarity of the free layer will change the resistance of the MTJ bit cell. For example, when the magnetization polarities are aligned or "parallel," a low resistance state ($R_L$) exists, which corresponds to a logical "0". When the magnetization polarities are not aligned or are "anti-parallel," a high resistance state ($R_H$) exists, which corresponds to a logical "1".

Thus, in magnetoresistive random access memory (MRAM), each bit cell (e.g., a MTJ bit cell) has a resistance value based on whether the bit cell represents a logical zero ("0") or a logical one ("1"). Specifically, the resistance of the bit cell ($R_{data}$) relates to the data stored in the bit cell.

Thus, in order to write a logical "0" or a logical "1," corresponding write currents are passed through the MTJ bit cell to effect a corresponding alignment of the free layer and the fixed layer, or in other words to program the MTJ bit cell to the corresponding resistance state.

In order to read the bit cell, a sensing current is passed through the bit cell and a voltage $V_{data}$ developed across the resistance $R_{data}$ is then compared to a reference voltage $V_{ref}$. If $V_{data}$ is high relative to $V_{ref}$, then the bit cell is determined to have a logical "1" stored therein. If $V_{data}$ is low relative to $V_{ref}$, then the bit cell is determined to have a logical "0" stored therein. The difference between the voltage across the bit cell $V_{data}$ and the reference voltage $V_{ref}$ (differential voltage $\Delta V = V_{data} - V_{ref}$) is therefore used to indicate the logic state stored in the bit cell. A sensing margin refers generally refers to the amount by which $\Delta V$ must be correctly sensed as positive or negative in order to correctly read the value stored in the bit cell as "1" or "0" respectively.

In general, the output voltage difference $\Delta V$ (=$V_{data} - V_{ref}$) in the sensing circuit is determined by the sensing current difference $\Delta I$ (=$I_{ref} - I_{data}$) and output resistance of load PMOS ($r_{O\_PLD}$): $\Delta V = \Delta I \cdot r_{O\_PLD}$.

For example, when the MTJ is state 0 ($R_{data} = R_L$):
$I_{data} > I_{ref}$ since $R_L < R_{ref}$;
$V_{data} < V_{ref}$; and
$\Delta V$ (=$V_{data} - V_{ref}$) becomes negative.
When the MTJ is state 1 ($R_{data} = R_H$):
$I_{data} < I_{ref}$ since $R_H > R_{ref}$;
$V_{data} > V_{ref}$; and
$\Delta V$ (=$V_{data} - V_{ref}$) becomes positive.

In conventional sense amplifiers, however, the sensing margin is degraded with technology scaling due to a decrease in supply voltage, an increase in process variation, and limited sensing current to prevent read disturbances. To combat these problems, designers have turned to tighter magnetic tunnel junction (MTJ) resistance (RL and RH) distributions or novel bit-cell structures (e.g., separated read and write paths). Unfortunately, these solutions have their own problems, such as poor sensing margins and slow speeds along with issues in manufacturing process variations that result in widely varying performance of the circuits. In general, the degradation in the sensing margin is overcome by using offset tolerant sensing circuits. However, these circuits have inherent performance degradation because of the use of a multi-stage sensing operation.

FIG. 1A illustrates a conventional sensing circuit. To consider offset effect in the sensing circuit, following terminologies are defined:

$V_{data\_ideal}$: $V_{data}$ in case of no process variation in the sensing circuit;

$V_{ref\_ideal}$: $V_{ref}$ in case of no process variation in the sensing circuit;

$V_{SC\_OS1}$: offset voltage caused by the process variation in the left branch of sensing circuit;

$V_{SC\_OS2}$: offset voltage caused by the process variation in the right branch of sensing circuit;

$V_{data} = V_{data\_ideal} + V_{SC\_OS1}$;
$V_{ref} = V_{ref\_ideal} + V_{SC\_OS2}$; and
$\Delta V_{ideal} = |V_{data\_ideal} - V_{ref\_ideal}|$.

FIG. 1B illustrates the two stages of operation for a conventional offset tolerant sensing circuit, such as that shown in FIG. 1A. As shown in FIG. 1B, When $R_{data} = R_L$:
$V_{SA\_data} = V_{data\_1st\_ideal} + V_{SC\_OS1}$;
$V_{SA\_REF} = V_{ref\_2nd\_ideal} + V_{SC\_OS1}$;
$V_{SA\_data} - V_{SA\_REF} = -2\Delta V_{ideal}$;
where $V_{data\_1st\_ideal}$;
$= (V_{data0\_ideal} + V_{data1\_ideal})/2 - \Delta V_{ideal}$;
$V_{ref\_2nd\_ideal}$; and
$= (V_{data0\_ideal} + V_{data1\_ideal})/2 + \Delta V_{ideal}$
When $R_{data} = R_H$:
$V_{SA\_data} = V_{data\_1st\_ideal} + V_{SC\_OS1}$
$V_{SA\_REF} = V_{ref\_2nd\_ideal} + V_{SC\_OS1}$
$V_{SA\_data} - V_{SA\_REF} = 2\Delta V_{ideal}$
where $V_{data\_1st\_ideal}$
$= (V_{data0\_ideal} + V_{data1\_ideal})/2 + \Delta V_{ideal}$
$V_{ref\_2nd\_ideal}$
$= (V_{data0\_ideal} + V_{data1\_ideal})/2 - \Delta V_{ideal}$ Note that the offset voltage ($V_{SC\_OS}$) in the sensing circuit is canceled out.

In addition, conventional offset tolerant sensing circuits use an irregular array structure. FIGS. 1C and 1D illustrates examples of a conventional offset tolerant sensing circuit in an irregular array structure. In FIG. 1C, a conventional offset tolerant sensing circuits in an irregular array structure uses two single pass transistor and double MTJs for Rref generation (two 1T2MTJs). The irregular array structure using two 1T2MTJs has the following problems in the reference cell: regularity problem because the reference cell requires a 1T2MTJ cell that is different from the 1T1MTJ data cell; write current degradation because of the serially connected $R_L$ and $R_H$ reference cells; and area overhead because of the inherent characteristics of the reference bit line (Ref-BL) structure: the number of word lines (WLs, e.g. 512) is much greater than the number of bit lines (BLs, e.g. 16) corresponding to an sense amplifier (SA).

In FIG. 1D, a conventional offset tolerant sensing circuits in an irregular array structure uses four single pass transistor and single MTJ for Rref generation (four 1T1MTJs). The irregular array structure using four 1T1MTJs has the following problems in the reference cell: control signal complexity because only one reference cell is used for every four BLs; and area overhead due to the additional write driver. For effective offset-tolerant sensing, as shown, a conventional offset tolerant sensing circuit in an irregular array structure may cause a regularity problem, additional cost, and design complexity over the previous offset tolerant sensing scheme.

Thus, an offset tolerant sensing scheme with a regular array structure is needed that does not have a regularity problem, additional costs, and design difficulty. Accordingly, there is a need for systems, apparatus, and methods that improve upon conventional approaches including the improved methods, systems, and apparatus provided hereby for removing the effect of offset voltages in correctly sensing or reading the bit cells of a MTJ array without requiring "irregular" structures like specially created reference cells, whose structure is different from the structure of the data cells.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, a current sense system may include: a sense amplifier configured to receive an input signal, the sense amplifier having a first voltage output and a second voltage output; a current sensing circuit configured to sense a current difference between the first voltage output and the second voltage output, the current sensing circuit having a third voltage output and a fourth voltage output and coupled to the first voltage output and the second voltage output; a data load selectively coupled to the third voltage output and the fourth voltage output; a first reference load selectively coupled to the fourth voltage output; and a second reference load selectively coupled to the third voltage output.

In another aspect, a current sensing circuit may include: a sense amplifier configured to output a data voltage and a reference voltage; a current sensing circuit coupled to the sense amplifier for receiving the data voltage and the reference voltage, the current sensing circuit outputting a first data current and a first reference current; a data cell selectively coupled to the first data current and the first reference current; and a reference cell selectively coupled to the first data current and the first reference current.

In still another aspect, a memory array may include: a sense amplifier configured to receive an input signal, the sense amplifier having a first voltage output and a second voltage output; a current sensing circuit configured to sense a current difference between the first voltage output and the second voltage output, the current sensing circuit having a third voltage output and a fourth voltage output and coupled to the first voltage output and the second voltage output; a plurality of data cells arranged in a regular array structure, each of the plurality of data cells selectively coupled to the third voltage output and the fourth voltage output; a first plurality of reference cells, each of the first plurality of reference cells selectively coupled to the fourth voltage output; and a second plurality of reference cells, each of the second plurality of reference cells selectively coupled to the third voltage output.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which:

FIG. 1A illustrates a schematic circuit diagram for conventional sensing circuit coupled to a data cell.

FIG. 1B illustrates a schematic circuit diagram for a two stage conventional sensing circuit.

FIG. 1C illustrates a schematic circuit diagram for a conventional sensing circuit in an irregular array structure using two 1T2MTJs.

FIG. 1D illustrates a schematic circuit diagram for a conventional sensing circuit in an irregular array structure using four 1T1MTJs.

Figure 2A:
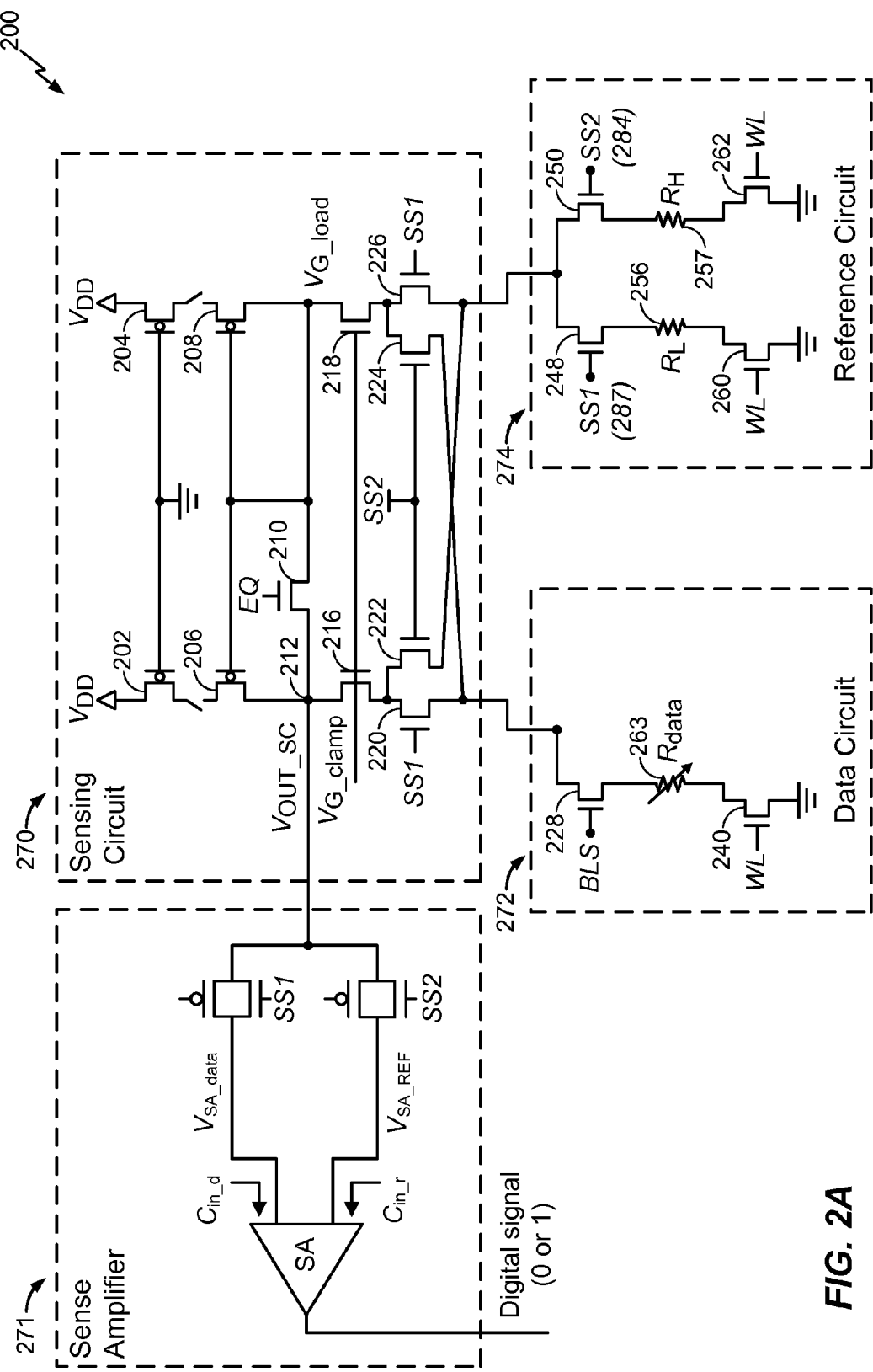
FIG. 2A illustrates an exemplary schematic circuit diagram for a sensing circuit coupled to a data cell in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein advantageously address the industry needs, as well as other previously unidentified needs, and mitigate shortcomings of the conventional methods, apparatus, and systems. For example, an offset tolerant sensing scheme with regular array structure that has the advantages of no regularity problems, no additional cost, and design easiness may include a sensing circuit with a selectively coupled resistor cell ($R_L/R_H$ cell) for use during different operations of the sensing circuit such that the resistor cell is the same as the data cell (resistive memory bit cell) unlike the use of a reference cell ($R_{ref}$ cell) of an irregular array structure.

With reference now to FIG. 2A, circuit 200 may be utilized for reading a bit cell in an MRAM array. Circuit 200 includes sensing circuit 270, sense amplifier 271, data circuit 272, and reference circuit 274. Sensing circuit 270 is configured as a dual stage sensing circuit. The operation of these circuits in each of the two stages will be discussed in further detail with reference to FIG. 2B. In general, sensing circuit 270 is configured to sense a difference between data voltage Vdata developed across bit cell 236 in data circuit 272 and reference voltage Vref developed across reference cell 256 or reference cell 257 in reference circuit 274. Upon completion of the second stage the difference between the data voltage and reference voltage, i.e., ΔV=Vdata−Vref is sensed for determining the value stored in bit cell 236 (once again, if ΔV is positive, then the value stored in bit cell 236 is read as a logical value "1" and if ΔV is negative, the value stored in bit cell 236 is read as a logical value "0.")

In further detail, data circuit 272 includes bit cell 236, which may be an MTJ. Bit cell 236 may be in a row "i" of the MRAM array, and thus, may be selected by the word line WLi and bit-line (BL sel). The same word line WLi and SS1 or SS2 are used to select reference cell 256 (SS1) or reference cell 257 (SS2) in reference circuit 274 for a sensing operation of bit cell 236. Pull-down transistors 240, 260 and 262 (e.g., n-channel metal oxide semiconductor (NMOS transistors) may enable current flow through selected bit cell 236, reference cell 256, and reference cell 257. In sensing circuit 270, stage selection transistors 220 and 226 (e.g., NMOS transistors) are enabled by control signal SS1 in a first stage 292 (see FIG. 2B) and stage selection transistors 222 and 224 (e.g., NMOS transistors) are enabled by control signal SS2 in a second stage 293 (see FIG. 2B). The voltage clamp signal VG_clamp is supplied by an external source and is used to clamp the gate voltages of data clamp transistor 216 (e.g., an NMOS transistor) and reference clamp transistor 218 (e.g., an NMOS transistor). Thus, VG_clamp controls the current passing through bit cell 236 and reference cell 256 or reference cell 257. During a read operation, data voltage Vdata is developed at node 212 and reference voltage Vref is developed at node 214.

Equalization transistor 210 (e.g., an NMOS transistor) is controlled by equalization signal EQ. Data load transistor 206 (e.g., a p-channel metal oxide semiconductor (PMOS) transistor) and reference load transistor 208 (e.g., a PMOS transistor) are diode-connected. Reference load transistor 208 is coupled to reference node 214 at which reference gate voltage VG_load is generated. Once the read operation is completed, the output, i.e., the data value stored in bit cell 236 is available at output node 212 which provides output VOUT_SC. Degeneration transistors 202 and 204 (e.g., PMOS transistors) are activated by coupling their gates to ground voltage and one of their terminals (e.g., source terminal) coupled to positive power supply voltage Vdd.

Figure 2B:
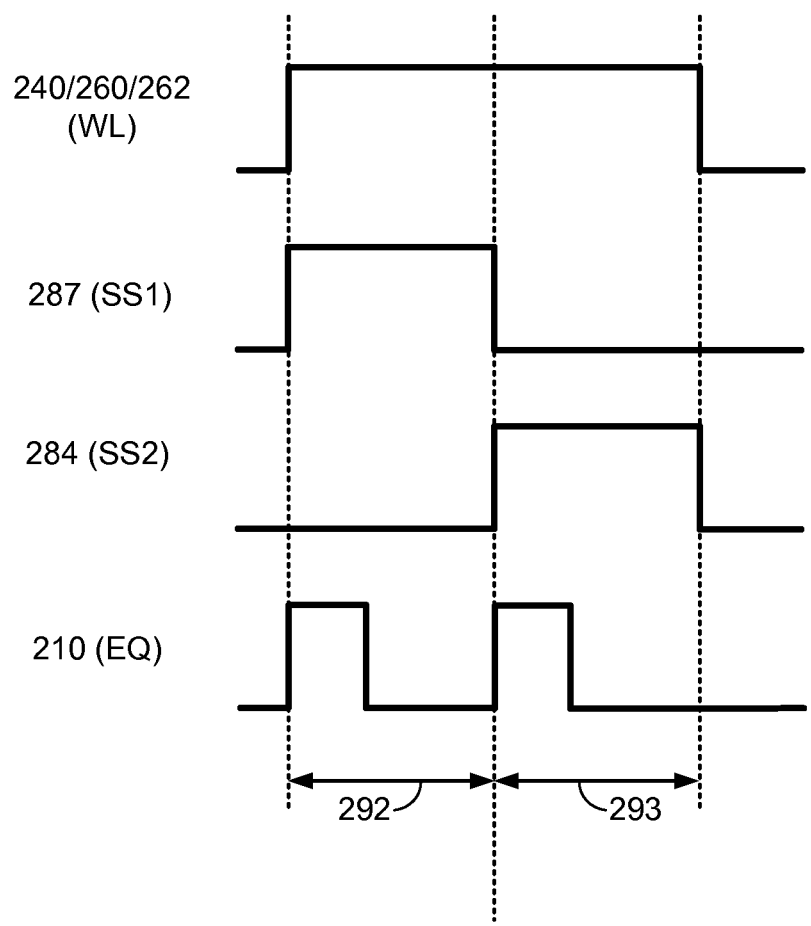
FIG. 2B illustrates an exemplary timing diagram for a sensing circuit in accordance with some examples of the disclosure.

With reference now to FIG. 2B, a first stage 292 of the sensing operation will be described. The first stage 292 is entered by turning on the stage selection signal SS1 (287) and turning off the stage selection signal SS2 (284). Initially, at a starting point of the first stage 292, equalization signal EQ is driven high to turn on equalization transistor 210, which equalizes nodes 212 and 214 to the same voltage. Nodes 212 and 214 are rapidly charged through degeneration PMOS transistors 202 and 204, which leads to an improvement in sensing speed. Once nodes 212 and 214 are equalized and charged, the equalization signal EQ is driven low, which causes equalization transistor 210 to be turned off, thus, decoupling nodes 212 and 214. A first reference gate voltage VG_load1 appears at reference node 214 in this first stage 292 based on bit cell 236 and reference cell 256.

On the data side, current Istage1 flows through data clamp transistor 212, stage selection transistor 220, BL selection transistor 228 (since control signal BLS is high), into bit cell 236 in a first direction. The current Istage1 is a first pulse of the sensing current for reading bit cell 236, passed in the first direction. At node 212, the voltage data voltage Vdata is formed. It is noted that Vdata at node 212 in the first stage 292 is based on the first reference gate voltage VG_load1 at node 214. The data voltage Vdata developed in the first stage is stored in a first storage means such as a first capacitor, until the second stage completes (at which point, Vref will be available, for determining ΔV=Vdata−Vref in a sense amplifier). The first capacitor may comprise, for example, gate capacitors and diffusion capacitors of the transistors (e.g., NMOS and PMOS) in circuit 200.

The second stage 293 is entered by turning on the stage selection signal SS2 (284) and turning off the stage selection signal SS1 (287). Once again, at a starting point of the second stage 293, equalization signal EQ is driven high to turn on equalization transistor 210, which resets nodes 212 and 214 to the same voltage. Following this, the equalization signal EQ is driven low, which causes equalization transistor 210 to be turned off, severing the connection between nodes 212 and 214.

In the second stage 293, a second reference gate voltage VG_load2 appears at node 214, based on bit cell 236 and reference cell 257. In more detail, in the second stage 293, current Istage2 flows through reference clamp transistor 218, stage selection transistor 224, into bit cell 236 in a second direction, and pull-down transistor 240. The current Istage2 is a second pulse of the sensing current for reading bit cell 236, passed in the second direction. At node 212, reference voltage Vref is formed based on the second reference gate voltage VG_load2. Reference voltage Vref is stored in a second storage means such as a second capacitor. The second capacitor may also comprise, for example, gate capacitors and diffusion capacitors of the transistors (e.g., NMOS and PMOS) in circuit 200. For example, When $R_{data}=R_L$:

$V_{SA\_data}=V_{data\_1st\_ideal}+V_{SC\_OS1}$
$V_{SA\_REF}=V_{ref\_2nd\_ideal}+V_{SC\_OS1}$
$V_{SA\_data}-V_{SA\_REF}=-2\Delta V_{ideal}$
where $V_{data\_1st\_ideal}$
$=(V_{data0\_ideal}+V_{data1\_ideal})/2$
$V_{ref\_2nd\_ideal}$
$=(V_{data0\_ideal}+V_{data1\_ideal})/2+2\Delta V_{ideal}$
And when $R_{data}=R_H$:
$V_{SA\_data}=V_{data\_1st\_ideal}+V_{SC\_OS1}$
$V_{SA\_REF}=V_{ref\_2nd\_ideal}+V_{SC\_OS1}$
$V_{SA\_data}-V_{SA\_REF}=2\Delta V_{ideal}$
Where $V_{data\_1st\_ideal}$
$=(V_{data0\_ideal}+V_{data1\_ideal})/2+2\Delta V_{ideal}$ (Note: $\Delta V=\Delta I*r_{O\_PLD}$ when $\Delta I=|I_{Rdata}-I_{Rref}|$. ΔI flowing between $R_L$ and $R_H$ is two times larger than ΔI flowing between $R_L$ (or $R_H$) and $R_{ref}$)
$V_{ref\_2nd\_ideal}$
$=(V_{data0\_ideal}+V_{data1\_ideal})/2$ Note that the offset voltage ($V_{SC\_OS}$) in the sensing circuit is canceled out.

Circuit 200 may include a sense amplifier 271 as illustrated. Sense amplifier 271 may be coupled to sensing circuit 200 in order to amplify the voltage difference ΔV, between the data voltage Vdata, available at node 212, at the end of the first stage 292, and reference voltage Vref, also available at node 212, at the end of the second stage 293. Sense amplifier 271 may be activated using signal SAE after the dual-stage operation is completed, as described previously, at which point, Vdata and Vref would have been stored in the first and second capacitors. After the dual-stage operation, when signal SAE is driven high and sense amplifier 271 is activated, which magnifies the difference between Vdata and Vref and causes the voltages of the output nodes OUT and OUTB to become rail-to-rail voltages corresponding to a logical value of "0" on one output node and "1" on the other output node. Sense amplifier 271 may be coupled to circuit 200 using pass gates and staged enable signals such that the values of Vref and Vdata available at different times from the same node may be transferred to inputs of sense amplifier 271. A further detailed explanation of the cooperation of sense amplifier 271 with circuit 200 will be avoided in this disclosure, for the sake of brevity.

Figure 3:
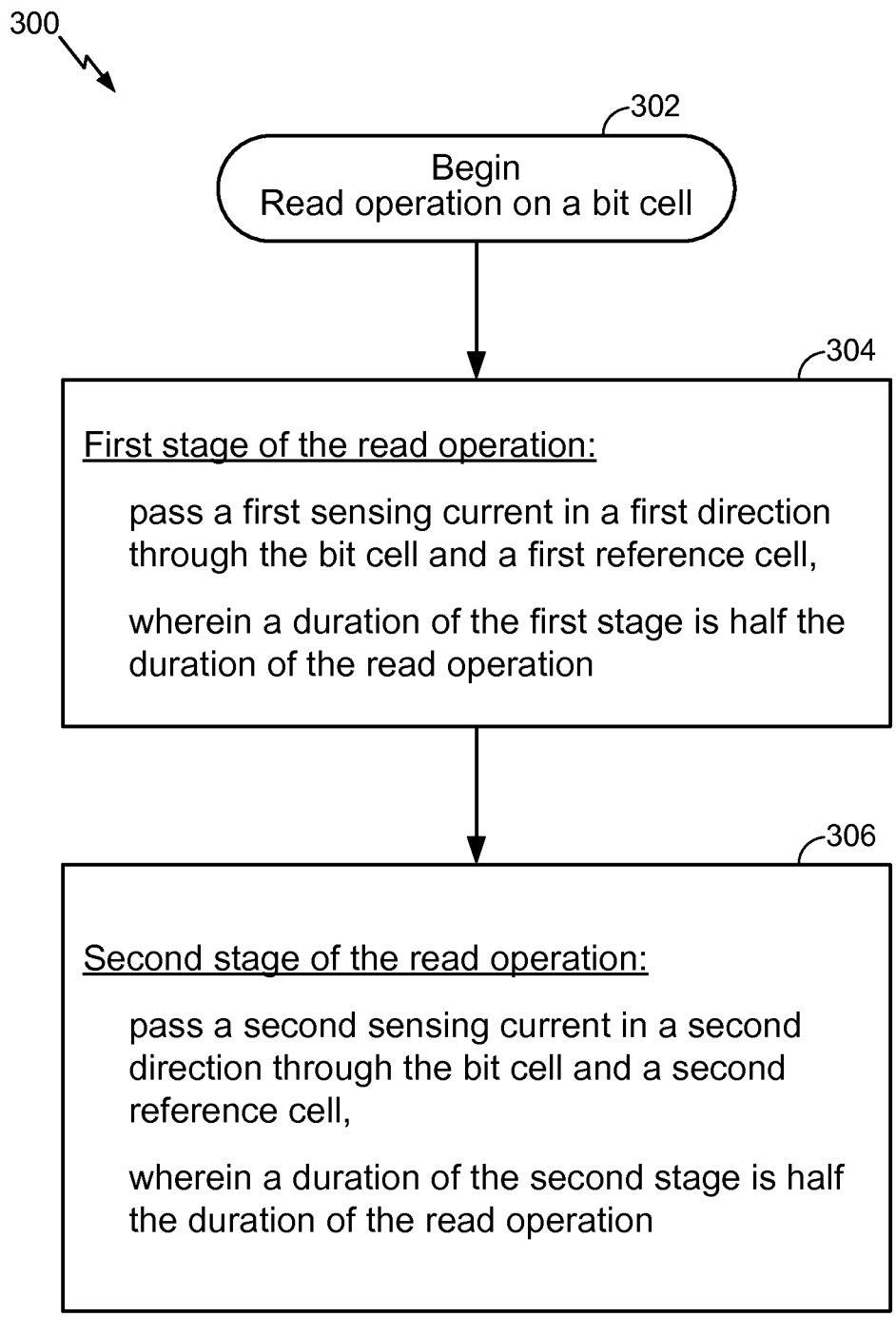
FIG. 3 illustrates a flow chart related to a method of dual stage sensing of a resistive memory bit cell in accordance with some examples of the disclosure.

It will be appreciated that exemplary aspects include various methods for performing the processes and functions disclosed herein. For example, as illustrated in FIG. 3, an exemplary aspect can include a method (300) of reading a resistive memory bit cell (e.g., 236). At Block 302, the method for reading the bit cell begins. During a first stage of the read operation on the bit cell (Block 304) a first sensing current (e.g., $I_{stage1}$) is passed in a first direction through the bit cell and a first reference cell (e.g. 256). During a second stage of the read operation (Block 306), a second sensing current (e.g., $I_{stage2}$) is passed in a second direction through the bit cell and a second reference cell (e.g. 257). In method 300, the duration of the first stage and a duration of the second stage are equal to half of a duration of the read operation, and a first resistance of the first reference cell is different from a second resistance of the second reference cell.

Figure 4:
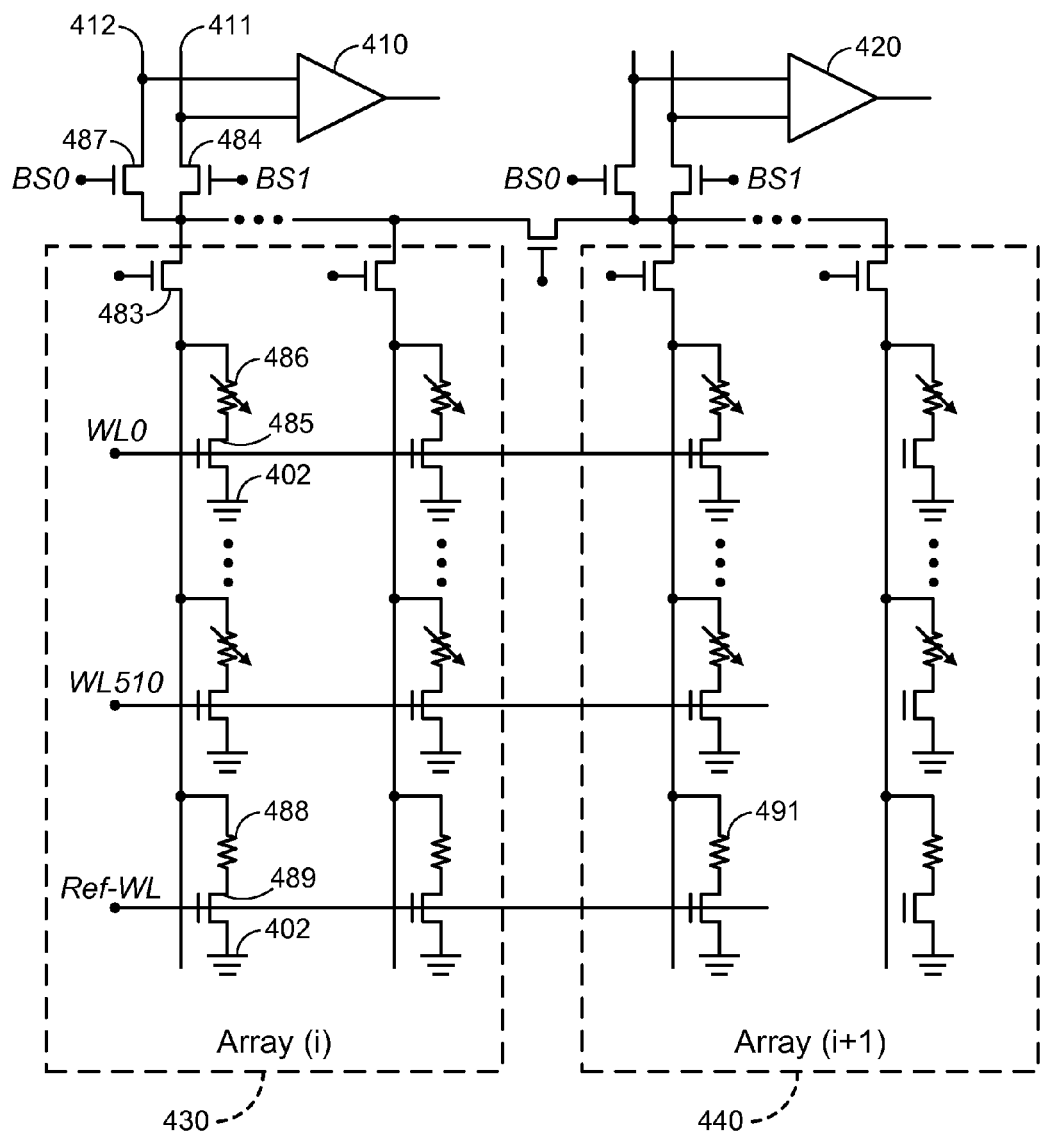
FIG. 4 illustrates a schematic circuit diagram of an exemplary regular array structure for a memory bank in accordance with some examples of the disclosure.

FIG. 4 illustrates an exemplary regular array structure for a memory bank in accordance with some examples of the disclosure. FIG. 4 shows an exemplary partial memory array 400 with an active bank of two data cells (Array (i) and Array (i+1)) but it should be understood that the memory array 400 may include more active memory arrays and non-active memory arrays. As shown in FIG. 4, a memory array 400 may include a first sense amplifier 410 coupled to a first memory array 430 and a second sense amplifier 420 coupled to a second memory array 440. The structure of the first memory array 430 and the second memory array 440 are similar and the following description, while focusing on the first memory array 430 (used in a first stage of operation), should be understood to apply to the second memory array 440 (used in a second stage of operation) as well. The first sense amplifier 410 may include a first voltage output 411 and a second voltage output 412 coupling the first sense amplifier 410 to the first memory array 430. The first voltage output 411 may be coupled to the first memory array 430 through a first select switch 483, a second select switch 487, and a third select switch 484, and operate similar to the select switches described with reference to FIGS. 2A and 2B. While only one branch of the first memory array 430 is described, this description applies similarly to the other branches within the first memory array 430. The first select switch 483 may be coupled to a first data cell 486 in series with a first word line switch 485 and a ground 402. A plurality of such configurations of a data cell is shown in FIG. 4 but only the first is described herein. The first select switch 483 may be coupled to a first reference cell 488 in series with a reference word line switch 489 and the ground 402. The second memory array 440 has a similar configuration as just described but it should be understood that the first reference cell 488 may be replaced with a second reference cell 491 similar to the second reference cell 257 for use during a second stage of operation similar to that described with reference to FIGS. 2A and 2B. Thus, unlike the use of $R_{ref}$ reference cell in a conventional memory bank with an irregular array structure, the regular array structure can be achieved. This is because the $R_L/R_H$ cell (first reference cell 488 and the second reference cell 491, which is the same as the data cell, is used as the reference cell. Accordingly, the offset-tolerant sensing scheme with regular-array-structure described herein has the advantages of no regularity problem, no additional cost, and design easiness.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 5:
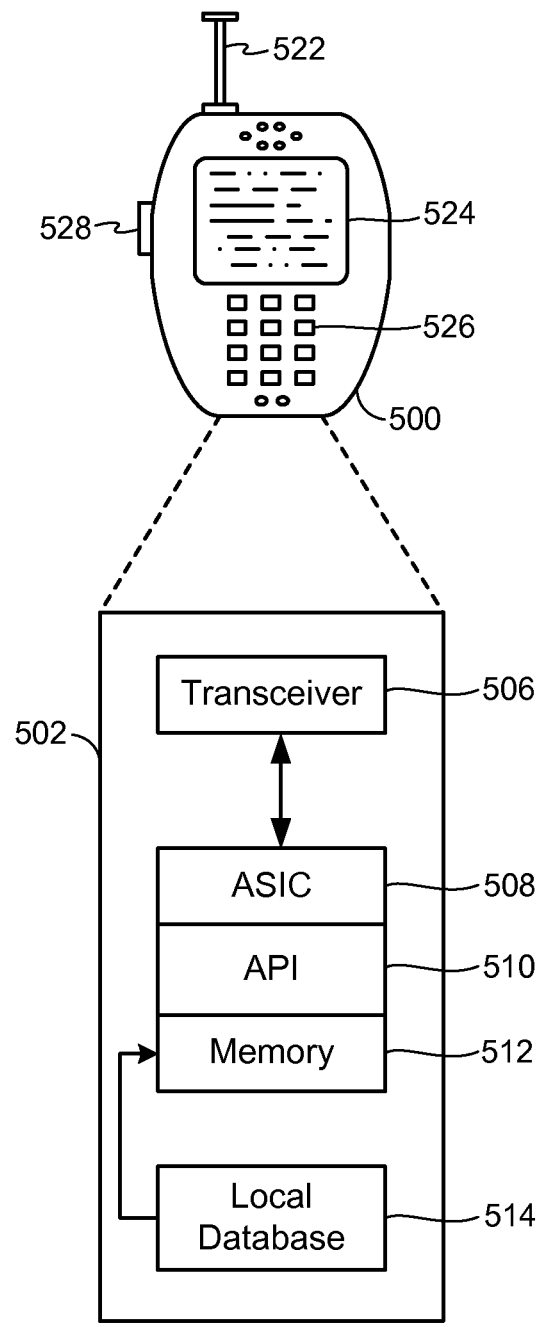
FIG. 5 illustrates exemplary user equipment (UE) in accordance with some examples of the disclosure.

Sensing circuits according to the examples above (e.g. the sensing circuit 200 and the memory array 400) can be used for a number of different applications, such as in the circuit components of a mobile device. Referring to FIG. 5 as an example, an UE 500, (here a wireless device), which has a platform 502 that can receive and execute software applications, data and/or commands transmitted from a radio access network (RAN) that may ultimately come from a core network, the Internet and/or other remote servers and networks. The platform 502 can include a transceiver 506 operably coupled to an application-specific integrated circuit (ASIC) 508, or other processor, microprocessor, logic circuit, or other data processing device. The ASIC 508 or other processor executes the application programming interface (API) 510 layer that interfaces with any resident programs in a memory 512 of the wireless device. The memory 512 can be comprised of read-only or random-access memory (RAM and ROM), EEPROM, flash cards, or any memory common to computer platforms, such as the current sensing circuit 100, the current sense system 200, and the memory array 500. The platform 502 also can include a local database 514 that can hold applications not actively used in the memory 512. The local database 514 is typically a flash data cell, but can be any secondary storage device as known in the art, such as magnetic media, EEPROM, optical media, tape, soft or hard disk, or the like. The platform 502 components can also be operably coupled to external devices such as an antenna 522, a display 524, a push-to-talk button 528, and a keypad 526 among other components, as is known in the art.

The wireless communication between UE 500 and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements.

Nothing stated or illustrated in this application is intended to dedicate any component, step, feature, benefit, advantage, or equivalent to the public, regardless of whether the component, step, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method step or as a feature of a method step. Analogously thereto, aspects described in connection with or as a method step also constitute a description of a corresponding block or detail or feature of a corresponding device. Some or all of the method steps can be performed by a hardware apparatus (or using a hardware apparatus), such as, for example, a microprocessor, a programmable computer, or an electronic circuit. In some examples, some or a plurality of the most important method steps can be performed by such an apparatus.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective steps or actions of this method.

Furthermore, in some examples, an individual step/action can be subdivided into a plurality of sub-steps or contain a plurality of sub-steps. Such sub-steps can be contained in the disclosure of the individual step and be part of the disclosure of the individual step.

While the foregoing disclosure shows illustrative examples of the disclosure, it should be noted that various changes and modifications could be made herein without departing from the scope of the disclosure as defined by the appended claims. The functions, steps and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising:
   a sense amplifier configured to input a first voltage output and a second voltage output;
   a sensing circuit configured to sense a voltage difference between the first voltage output and the second voltage output and input a third voltage output and a fourth voltage output, the sensing circuit coupled to the first voltage output and the second voltage output and configured to cancel an offset voltage in a dual stage sensing operation;
   a data cell coupled to the third voltage output and the fourth voltage output;
   a first reference cell selectively coupled to the fourth voltage output; and
   a second reference cell selectively coupled to the third voltage output, wherein the data cell is configured the same as the first reference cell and the second reference cell to form a regular array structure.

2. The apparatus of claim 1, further comprising:
   a first select switch configured to couple the data cell to a ground;
   a second select switch configured to couple the first reference cell to the ground; and
   a third select switch configured to couple the second reference cell to the ground.

3. The apparatus of claim 1, wherein the data cell is coupled to the third voltage output and the first reference cell is coupled to the fourth voltage output during a first stage of operation.

4. The apparatus of claim 3, wherein the data cell is coupled to the fourth voltage output and the second reference cell is coupled to the third voltage output during a second stage of operation.

5. The apparatus of claim 1, wherein the first reference cell has a first resistance greater than a second resistance of the second reference cell.

6. The apparatus of claim 1, the first reference cell has a first resistance smaller than a second resistance of the second reference cell.

7. The apparatus of claim 1, wherein the data cell is a magnetic tunnel junction.

8. The apparatus of claim 1, wherein the sensing circuit is configured to cancel a first offset voltage in the third voltage output and a second offset voltage in the fourth voltage output.

9. The apparatus of claim 1, wherein the apparatus is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

10. A memory array, comprising:
a sense amplifier configured to input a first voltage output and a second voltage output;
a sensing circuit configured to sense a voltage difference between the first voltage output and the second voltage output and input a third voltage output and a fourth voltage output, the sensing circuit coupled to the first voltage output and the second voltage output and configured to cancel an offset voltage in a dual stage sensing operation;
a plurality of data cells arranged in a regular array structure, each of the plurality of data cells coupled to the third voltage output and the fourth voltage output;
a plurality of first reference cells, each of the plurality of first reference cells selectively coupled to the fourth voltage output; and
a plurality of second reference cells, each of the plurality of second reference cells selectively coupled to the third voltage output, wherein the plurality of data cells are configured the same as the plurality of first reference cells and the plurality of second reference cells to form a regular array structure.

11. The memory array of claim 10, further comprising:
a first select switch configured to couple each of the plurality of data cells to a ground;
a second select switch configured to couple each of the plurality of first reference cells to the ground; and
a third select switch configured to couple each of the plurality of second reference cells to the ground.

12. The memory array of claim 10, wherein at least one of the plurality of data cells is coupled to the third voltage output and at least one of the plurality of first reference cells is coupled to the fourth voltage output during a first stage of operation.

13. The memory array of claim 12, wherein the at least one of the plurality of data cells is coupled to the fourth voltage output and at least one of the plurality of second reference cells is coupled to the third voltage output during a second stage of operation.

14. The memory array of claim 10, wherein each of the plurality of first reference cells has a first resistance greater than a second resistance of each of the plurality of second reference cells.

15. The memory array of claim 10, wherein each of the plurality of first reference cells has a first resistance smaller than a second resistance of each of the plurality of second reference cells.

16. The memory array of claim 10, wherein each of the plurality of data cells is a magnetic tunnel junction.

17. The memory array of claim 10, wherein the sensing circuit is configured to cancel a first offset voltage in the third voltage output and a second offset voltage in the fourth voltage output.

18. The memory array of claim 10, wherein the memory array is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

19. A method of reading a resistive memory bit cell, the method comprising:
during a first stage of a dual stage sensing operation for a read operation on the resistive memory bit cell, passing a first sensing current in a first direction through the resistive memory bit cell and a first reference cell; and
during a second stage of the dual stage sensing operation for the read operation, passing a second sensing current in a second direction through the resistive memory bit cell and a second reference cell;
wherein the resistive memory bit cell is configured the same as the first reference cell and the second reference cell to form a regular array structure, wherein a duration of the first stage and a duration of the second stage are equal to half of a duration of the read operation, and wherein a first offset voltage during the first stage of the read operation cancels a second offset voltage during the second stage of the read operation.

20. The method of claim 19, wherein a first resistance of the first reference cell is different from a second resistance of the second reference cell.

* * * * *